(12) United States Patent
Kim

(10) Patent No.: US 10,991,446 B2
(45) Date of Patent: *Apr. 27, 2021

(54) ELECTRONIC DEVICE PERFORMING TRAINING ON MEMORY DEVICE BY RANK UNIT AND TRAINING METHOD THEREOF

(71) Applicant: SAMSUNG ELECTRONICS CO., LTD., Suwon-si (KR)

(72) Inventor: Yongseob Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/747,896

(22) Filed: Jan. 21, 2020

(65) Prior Publication Data

US 2020/0152287 A1 May 14, 2020

Related U.S. Application Data

(63) Continuation of application No. 16/034,848, filed on Jul. 13, 2018, now Pat. No. 10,566,075.

(30) Foreign Application Priority Data

Dec. 4, 2017 (KR) .......................... 10-2017-0165305

(51) Int. Cl.
| | |
|---|---|
| *G11C 29/50* | (2006.01) |
| *G11C 11/40* | (2006.01) |
| *G11C 11/402* | (2006.01) |
| *G11C 11/4099* | (2006.01) |
| *G11C 11/406* | (2006.01) |

(Continued)

(52) U.S. Cl.
CPC .............. *G11C 29/50* (2013.01); *G06F 11/00* (2013.01); *G06F 13/16* (2013.01); *G06F 13/42* (2013.01);
(Continued)

(58) Field of Classification Search
CPC ................ G11C 11/4023; G11C 29/50; G11C 11/40615; G11C 11/4099; G11C 8/00;
(Continued)

(56) References Cited

U.S. PATENT DOCUMENTS

| | | |
|---|---|---|
| 7,036,053 B2 | 4/2006 | Zumkehr et al. |
| 7,647,467 B1 | 1/2010 | Hutsell et al. |

(Continued)

*Primary Examiner* — Ajay Ojha
(74) *Attorney, Agent, or Firm* — F. Chau & Associates, LLC

(57) ABSTRACT

An electronic device includes a memory device including first and second ranks, and a system-on-chip that exchanges data with the memory device. The system-on-chip loads a first training code to the first rank and performs a first training operation on the second rank using the first training code loaded to the first rank, and loads the first training code to the second rank and performs a second training operation on the first rank using the first training code loaded to the second rank. The system-on-chip generates a first reference voltage for sampling output data of the first rank, and generates a second reference voltage for sampling output data of the second rank. The first and second reference voltages are generated based on a first result of performing the first training operation on the second rank, and a second result of performing the second training operation on the first rank.

20 Claims, 13 Drawing Sheets

(51) Int. Cl.
  *G06F 13/42*    (2006.01)
  *G06F 13/16*    (2006.01)
  *G11C 29/02*    (2006.01)
  *G06F 11/00*    (2006.01)
  *G11C 8/00*     (2006.01)
  *G11C 7/10*     (2006.01)
  *G11C 11/4093*  (2006.01)

(52) U.S. Cl.
  CPC ...... *G11C 11/4023* (2013.01); *G11C 11/4099* (2013.01); *G11C 11/40615* (2013.01); *G11C 29/022* (2013.01); *G11C 29/028* (2013.01); G11C 7/1084 (2013.01); G11C 7/1093 (2013.01); G11C 8/00 (2013.01); G11C 11/4093 (2013.01); G11C 2207/2254 (2013.01)

(58) Field of Classification Search
  CPC ........ G11C 2207/2254; G11C 11/4093; G11C 7/1093; G11C 7/1084; G11C 29/028; G11C 29/022; G06F 13/42; G06F 13/16; G06F 11/00
  See application file for complete search history.

(56) References Cited

U.S. PATENT DOCUMENTS

| | | | |
|---|---|---|---|
| 7,991,098 | B2 | 8/2011 | Hollis |
| 8,850,155 | B2 | 9/2014 | Brandl et al. |
| 9,135,981 | B2 | 9/2015 | Seo et al. |
| 9,214,199 | B2 | 12/2015 | Brandl et al. |
| 9,401,721 | B1 | 7/2016 | Barakat et al. |
| 9,558,850 | B1 | 1/2017 | Bialas, Jr. et al. |
| 2005/0190634 | A1 | 9/2005 | Lee |
| 2013/0182524 | A1 | 7/2013 | Jeon et al. |
| 2015/0089164 | A1 | 3/2015 | Ware et al. |
| 2015/0280709 | A1* | 10/2015 | Cho ................. H03K 19/0005 326/30 |
| 2016/0118121 | A1* | 4/2016 | Kelly ................. G11C 14/0018 710/301 |
| 2016/0179374 | A1* | 6/2016 | Berke ................. G06F 12/0607 711/104 |
| 2017/0358369 | A1 | 12/2017 | Chinnakkonda Vidyapoornachary et al. |
| 2019/0172516 | A1 | 6/2019 | Kim |

\* cited by examiner

ELECTRONIC DEVICE PERFORMING TRAINING ON MEMORY DEVICE BY RANK UNIT AND TRAINING METHOD THEREOF

CROSS-REFERENCE TO RELATED APPLICATIONS

This application is a continuation of U.S. patent application Ser. No. 16/034,848 filed Jul. 13, 2018, which claims priority under 35 U.S.C. § 119 to Korean Patent Application No. 10-2017-0165305 filed on Dec. 4, 2017, the disclosures of which are incorporated by reference herein in their entirety.

TECHNICAL FIELD

Exemplary embodiments of the inventive concept disclosed herein relate to a semiconductor device, and more particularly, to an electronic device performing software training on a memory device and a training method thereof.

DISCUSSION OF THE RELATED ART

The use of mobile devices such as smartphones, tablet personal computers, digital cameras, MP3 players, personal digital assistants (PDAs), wearable devices, etc., is increasing. An application processor (AP) is used as a core driving processor of such mobile devices. In addition, a volatile memory device such as a dynamic random access memory (DRAM) is used as a main memory or a working memory of the AP. The demand for high-performance and high-capacity memories accompanies a sharp increase in an operating frequency and a storage capacity of the working memory.

The increase in the operating speed makes it difficult to secure the integrity of data exchanged between the AP and the working memory (e.g., the DRAM). Optimizing a reference voltage or a clock timing of data or signals transferred through an interface may contribute to securing the integrity of data. The optimizing of the clock timing means optimum synchronization between a clock signal (or a strobe signal) and data. The reference voltage is used as a criterion for determining a logical value of data.

In general, training is performed on the DRAM for the purpose of increasing the integrity of data. A channel for exchanging data with the DRAM may be optimized by executing a training code. The size of a training code for providing increased performance and reliability is increasing. The training code is typically loaded into a static random access memory (SRAM). However, increasing the capacity of an SRAM to be large enough for loading a training code having an increased size causes an excessive increase in costs. For this reason, there have been attempts to load the training code to the DRAM and to train an input/output characteristic of the DRAM. However, various limitations, including the utilization of a rank-based interleaving mode to efficiently access the DRAM, have prevented implementation of loading the training code to the DRAM and finely setting operation parameters of the DRAM.

SUMMARY

Exemplary embodiments of the inventive concept provide an electronic device and a computing system for improving the integrity of output data of a dynamic random access memory (DRAM) accessed in a rank interleaving manner through training, and a training method thereof.

According to an exemplary embodiment, an electronic device includes a memory device including a first rank and a second rank, and a system-on-chip that exchanges data with the memory device. The system-on-chip loads a first training code to the first rank and performs a first training operation on the second rank using the first training code loaded to the first rank, and loads the first training code to the second rank and performs a second training operation on the first rank using the first training code loaded to the second rank. The system-on-chip generates a first reference voltage for sampling output data of the first rank, and generates a second reference voltage for sampling output data of the second rank. The first reference voltage and the second reference voltage are generated based on a first result of performing the first training operation on the second rank, and a second result of performing the second training operation on the first rank.

According to an exemplary embodiment, a training method of an electronic device including a system-on-chip and a memory device includes disabling a rank interleaving mode of the memory device, loading a training code to a first rank of the memory device, performing a first training operation on a second rank of the memory device by executing the training code loaded to the first rank, loading the training code to the second rank, performing a second training operation on the first rank by executing the training code loaded to the second rank, and storing results of performing the first and second training operations on the first and second ranks in a storage device. The results of performing the first and second training operations include a first reference voltage for sampling output data of the first rank, and a second reference voltage for sampling output data of the second rank.

According to an exemplary embodiment, an electronic device includes a memory device including a plurality of ranks, in which the memory device is accessed based on a rank interleaving mode, and a system-on-chip that performs a training operation on the memory device. The system-on-chip includes a plurality of reference voltage generators that generates a plurality of reference voltages for sampling output data of the plurality of ranks independently of each other.

According to an exemplary embodiment, a training method of an electronic device including a system-on-chip and a memory device includes loading a first training code to a first rank of the memory device, by the system-on chip, performing a first training operation on a second rank of the memory device, by the system-on-chip, using the first training code loaded to the first rank, loading the first training code to the second rank, by the system-on-chip, performing a second training operation on the first rank, by the system-on-chip, using the first training code loaded to the second rank, generating a first reference voltage for sampling output data of the first rank, by the system-on-chip, and generating a second reference voltage for sampling output data of the second rank, by the system-on-chip. The first reference voltage and the second reference voltage are generated based on a first result of performing the first training operation on the second rank, and a second result of performing the second training operation on the first rank.

BRIEF DESCRIPTION OF THE DRAWINGS

The above and other objects and features of the inventive concept will become apparent by describing in detail exemplary embodiments thereof with reference to the accompanying drawings, in which.

DETAILED DESCRIPTION OF THE EXEMPLARY EMBODIMENTS

Figure 1:
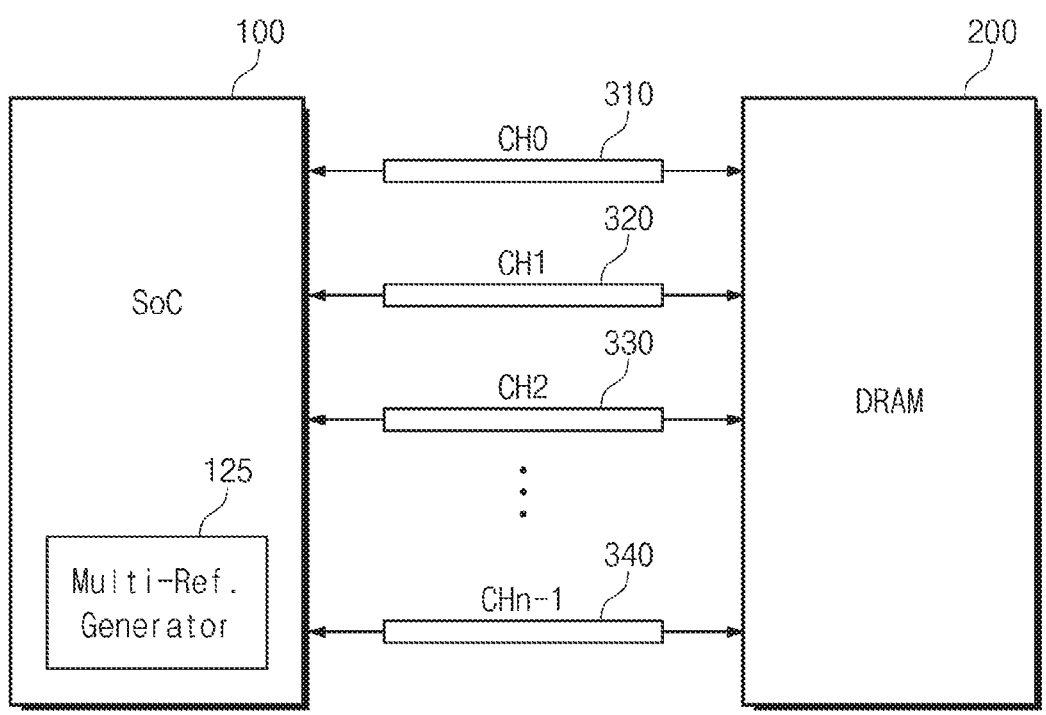
FIG. 1 is a block diagram illustrating an electronic device according to an exemplary embodiment of the inventive concept.

Exemplary embodiments of the inventive concept will be described more fully hereinafter with reference to the accompanying drawings. Like reference numerals may refer to like elements throughout the accompanying drawings.

Below, a dynamic random-access memory (DRAM) will be described as a main memory or a working memory to describe features and functions of exemplary embodiments of the inventive concept. However, exemplary embodiments of the inventive concept are not limited to being implemented with a DRAM. For example, the features of the inventive concept may be applied to a phase-change RAM (PRAM), a magnetoresistive RAM (MRAM), a resistive RAM (ReRAM), a ferroelectric RAM (FRAM), a NOR flash memory, etc. operating as a working memory device. Here, the working memory refers to a memory that stores an instruction or data that is processed in an electronic device. Herein, the term "training" refers to an operation of searching for a latency or a signal level of a memory channel to provide the optimum reliability.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

FIG. 1 is a block diagram illustrating an electronic device according to an exemplary embodiment of the inventive concept.

Referring to FIG. 1, an electronic device 10 includes a system-on-chip 100 and a DRAM 200. A plurality of channels 310, 320, 330, and 340 for data and signal exchange are provided between the system-on-chip 100 and the DRAM 200.

The system-on-chip 100 may execute various applications, based on a request of a user. To execute applications, the system-on-chip 100 loads and executes the applications to the DRAM 200. The system-on-chip 100 may drive an operating system (OS) and may execute various applications on the operating system. To this end, the system-on-chip 100 may write data in the DRAM 200 or may read data stored in the DRAM 200.

The system-on-chip 100 may include a memory controller that controls the DRAM 200. The system-on-chip 100 may include a multi-reference generator 125 (also referred to herein as a multi-reference voltage generator 125, or a multi-reference voltage generator circuit 125) that receives a data signal provided from the DRAM 200. The multi-reference generator 125 may be included in the memory controller. The system-on-chip 100 may determine a reference voltage for each rank of data output from the DRAM 200 through a training operation performed on the DRAM 200. The reference voltage for each rank is generated through the multi-reference generator 125. When receiving data from the DRAM 200 with rank interleaving enabled, the system-on-chip 100 may switch a plurality of reference voltages in synchronization with a rank interleaving period, thus improving the integrity of data received from each of the ranks.

The system-on-chip 100 may perform training on the DRAM 200 in booting or a specific situation. For example, the system-on-chip 100 may perform training on the DRAM 200 during a booting operation, or during another specific situation other than a booting operation. The system-on-chip 100 may improve the reliability of data or signal exchange with the DRAM 200 through the training operation. For example, the system-on-chip 100 may write or read training data to or from the DRAM 200 in various conditions to determine an optimum clock timing or an optimum level of a reference level.

For example, the system-on-chip 100 according to exemplary embodiments of the inventive concept may load a training code (hereinafter referred to as a TC) to the DRAM 200. The training code TC is used to train the DRAM 200. The training code TC substantially corresponds to an execution code for performing software training. If an error occurs in the training code TC, overall training operations may fail. Accordingly, there is a need to secure the stability of the training code TC for securing the integrity of data or signals transmitted between the system-on-chip 100 and the DRAM 200.

One of a number of factors having influence on the stability of the training code TC is rank interleaving of the DRAM 200. For example, each of the channels CH0 to CHn-1 of the DRAM 200 periodically performs rank interleaving to increase access performance. Through rank interleaving, one piece of data is partitioned to a plurality of interleaving units (hereinafter referred to as RN) in size and are stored in different ranks. However, through rank interleaving, the training code TC of a relatively great size may be partitioned to and stored in dies of different ranks. In this case, it is difficult to perform software training.

In exemplary embodiments, in software training of the DRAM 200, the system-on-chip 100 determines a reference voltage of a second rank by loading the training code TC to a first rank and training the second rank. Then, the system-on-chip 100 determines a reference voltage of the first rank by loading the training code TC to the second rank and training the first rank. In exemplary embodiments, rank interleaving may be disabled or the size of the interleaving unit IU may be adjusted prior to performing training for each rank. The system-on-chip 100 may differently determine a level of a reference voltage for each rank through the training operation for the DRAM 200. Here, the reference voltage for each rank means a voltage for receiving data from each rank of the DRAM 200. The multi-reference generator 125 may be set by using a value determined through the training operation so as to generate the reference voltage for each rank. A method of adjusting an interleaving size of the first rank and the second rank, or disabling rank interleaving, will be described in detail with reference to the following drawings.

The system-on-chip 100 accesses the DRAM 200 in response to requests of various master intellectual property (IP) blocks. The system-on-chip 100 may transfer a data signal DQ in synchronization with a strobe signal DQS in response to a request for access to the DRAM 200. Alternatively, the system-on-chip 100 may receive the data signal DQ output from the DRAM 200 in synchronization with the strobe signal DQS. For example, in exemplary embodiments, the system-on-chip 100 may dynamically change a level of a reference voltage for receiving data output from the DRAM 200, depending on a rank interleaving manner. Accordingly, the system-on-chip 100 may compensate for a characteristic difference of a data signal occurring by units of ranks by using a multi-reference voltage. As a result, the integrity of data output from the DRAM 200 in a read operation may be improved.

The DRAM 200 is provided as main memory of the electronic device 10. The operating system OS or application programs may be loaded to the DRAM 200 in a booting operation of the electronic device 10. For example, when the system-on-chip 100 is booted up, an OS image stored in a storage device is loaded to the DRAM 200 based on a booting sequence. Overall input/output operations of the system-on-chip 100 may be supported by the operating system. Similarly, application programs that are selected by a user or are used for a basic service may be loaded to the DRAM 200. In addition, the DRAM 200 may be used as a buffer memory that stores image data provided from an image sensor such as, for example, a camera.

The DRAM 200 may be a volatile memory that is accessible in units of bytes. Alternatively, the DRAM 200 may be an over-writable nonvolatile memory device. For example, the DRAM 200 may be implemented with a nonvolatile RAM such as a PRAM, an MRAM, a ReRAM, a FRAM, or a NOR flash memory. When the electronic device 10 is driven, an operating system OS, a running application program, data to be updated, etc., are stored in the DRAM 200. The DRAM 200 may be implemented in the form of a multi-chip package in which a plurality of chips are stacked, or in the form of a module. However, the manner of manufacturing the DRAM 200 is not limited to the disclosure herein.

The channels 310, 320, 330, and 340 provide transmission paths for data or signals between the system-on-chip 100 and the DRAM 200. Each of the channels 310, 320, 330, and 340 provides a data path allowing the DRAM 200 and the system-on-chip 100 to transmit data independently. For example, while the data signal DQ and the strobe signal DQS are transmitted through the first channel 310, another data signal DQ and another strobe signal DQS may be transmitted through the second channel 320. For example, each of the channels 310, 320, 330, and 340 may include a plurality of ranks. In one channel, interleaving may be performed by the rank.

Configurations of the DRAM 200, into which the training code TC is loaded, and the system-on-chip 100, which trains the DRAM 200 by using the training code TC, are described herein. For example, in exemplary embodiments, the system-on-chip 100 may select a reference voltage for receiving data transmitted from the DRAM 200 in units of ranks. In addition, the system-on-chip 100 may determine an optimum reference voltage for each rank through a training operation, and may receive output data of the DRAM 200 by using the determined reference voltage. The integrity of output data of the DRAM 200 may be improved by the above-described configuration and function.

Figure 2:
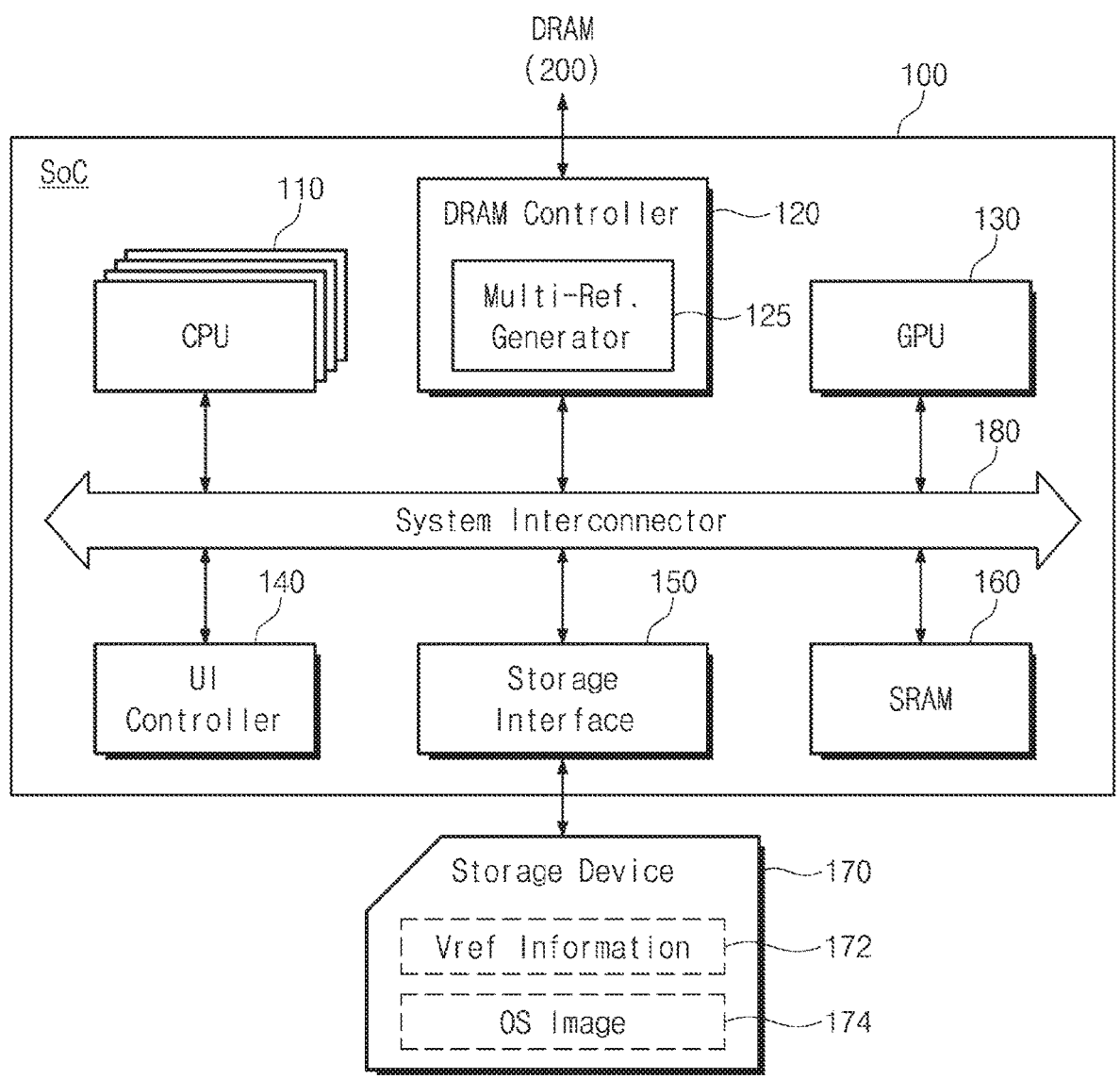
FIG. 2 is a block diagram illustrating a structure of a system-on-chip according to an exemplary embodiment of the inventive concept.

FIG. 2 is a block diagram illustrating a structure of a system-on-chip according to an exemplary embodiment of the inventive concept.

Referring to FIG. 2, in an exemplary embodiment, the system-on-chip 100 is connected to the DRAM 200 and a storage device 170. The system-on-chip 100 may also be connected to a device such as, for example, a liquid crystal display device or a touch panel.

In exemplary embodiments, the system-on-chip 100 includes a central processing unit (CPU) 110, a DRAM controller 120 (also referred to herein as a DRAM controller circuit 120 or a memory controller circuit 120), a graphics processing unit (GPU) 130, a user interface (UI) controller 140, a storage interface 150, a static random access memory (SRAM) 160, and a system interconnector 180. It should be understood that components of the system-on-chip 100 are not limited to the components illustrated in FIG. 2. For example, the system-on-chip 100 may further include a hardware codec for processing image data, a secure block, etc.

The CPU 110 executes software (e.g., an application program, an operating system, device drivers, etc.) to be executed in the system-on-chip 100. The CPU 110 may execute the operating system OS loaded to the DRAM 200. The CPU 110 may execute various application programs to be driven based on the operating system OS. For example, the CPU 110 may fetch and execute the training code TC loaded to the SRAM 160 or the DRAM 200. The CPU 110 may control the DRAM controller 120 such that the training operation of the DRAM 200 requested according to the execution of the training code TC is performed. The CPU 110 may be, for example, a homogeneous multi-core processor or a heterogeneous multi-core processor.

The DRAM controller 120 provides interfacing between the DRAM 200 and the system-on-chip 100. The DRAM controller 120 may access the DRAM 200 in response to a request of the CPU 110 or any other IP block. For example, the DRAM controller 120 may write data in the DRAM 200 in response to a write request of the CPU 110. Alternatively, the DRAM controller 120 may read data from the DRAM 200 and may transfer the read data to the CPU 110 or the storage interface 150. For a training operation, the DRAM controller 120 may disable rank interleaving associated with the DRAM 200 or may adjust the size of an interleaving unit. In addition, in the training operation, in response to a request of the CPU 110, the DRAM controller 120 may disable channel interleaving or may adjust a unit of the channel interleaving.

In exemplary embodiments, the DRAM controller 120 includes the multi-reference generator 125. Through the training operation of the system-on-chip 100, a voltage level of a data signal of each rank of the DRAM 200 may be detected, and a reference voltage of an optimum level for sampling data may be determined for each rank of the DRAM 200. The multi-reference generator 125 may be set to generate the determined reference voltage. When software training ends, the DRAM controller 120 may select a reference voltage for receiving data transmitted from the DRAM 200 in units of ranks. An exemplary structure of the multi-reference generator 125 will be described in detail with reference to FIG. 3.

The GPU 130 performs various graphic operations in response to a request of the CPU 110. For example, the GPU 130 may convert process-requested data to data suitable for a display. The GPU 130 has an operation structure that is suitable for parallel processing in which similar operations are repeatedly processed. Accordingly, the GPU 130 has a structure that may be used to perform various operations requiring high-speed parallel processing as well as a graphic operation.

The user interface controller 140 controls user inputs and outputs to and from user interface devices (e.g., a keyboard, a touch panel, and a display). For example, the user interface controller 140 may display a keyboard screen for inputting data to the display under control of the CPU 110. Alternatively, the user interface controller 140 may control the display such that the user-requested data is displayed. The user interface controller 140 may decode data, which is provided from user input devices such as a keyboard, a mouse, and a touch panel, to user input data.

The storage interface 150 controls the storage device 170 in response to a request of the CPU 110. For example, the storage interface 150 provides an interface between the system-on-chip 100 and the storage device 170. For example, data processed by the CPU 110 is stored in the storage device 170 through the storage interface 150. In addition, data stored in the storage device 170 may be provided to the CPU 110 through the storage interface 150. Parameters determined through the training operation according to exemplary embodiments of the inventive concept may be stored in the storage device 170 through the storage interface 150.

The SRAM 160 may be provided as a working memory of the CPU 110. For example, a boot loader for executing booting or codes may be loaded to the SRAM 160. For example, the training code TC may be loaded to the SRAM 160 for a training operation. For example, the training code TC associated with coarse training for securing basic communication with the DRAM 200 may be loaded to the SRAM 160.

The system interconnector 180 is a system bus that provides an on-chip network within the system-on-chip 100. The system interconnector 180 may include, for example, a data bus, an address bus, and a control bus. The data bus is a path through which data moves. The data bus may primarily provide a memory access path through which the DRAM 200 or the storage device 170 is accessed. The address bus provides an address exchange path between IP blocks. The control bus provides a path through which control signals are transferred between the IP blocks. However, a configuration of the system interconnector 180 is not limited thereto, and the system interconnector 180 may further include, for example, arbitration devices for efficient management.

The storage device 170 is provided as a storage medium of the system-on-chip 100. The storage device 170 may store application programs, an OS image 174, and various other types of data. For example, in exemplary embodiments, the training code TC for training the DRAM 200 is stored in a specific region of the storage device 170. However, it is to be understood that in exemplary embodiments, the training code TC may also be stored in any other nonvolatile memory other than the storage device 170. In addition, the storage device 170 may store various operation parameters obtained as a result of software training. For example, in exemplary embodiments, reference voltage information 172 assigned for each rank and obtained as the training result of the DRAM 200 is stored in the storage device 170. The storage device 170 may be implemented with a memory card (e.g., MMC, eMMC, SD, and microSD). The storage device 170 may include a NAND-type flash memory having a high storage capacity. Alternatively, the storage device 170 may include a next-generation nonvolatile memory, such as a PRAM, an MRAM, a ReRAM, or a FRAM, or a NOR flash memory. Alternatively, the storage device 170 may be an embedded memory that is provided within the system-on-chip 100.

According to the above description, the system-on-chip 100 may load the training code TC to the SRAM 160 or the DRAM 200 for the purpose of performing training on the DRAM 200. To load the training code TC to the DRAM 200, the DRAM controller 120 may disable a rank interleaving mode of the DRAM 200. Alternatively, to load the training code TC to the DRAM 200, the DRAM controller 120 may adjust the size of the rank interleaving unit of the DRAM 200. In exemplary embodiments, a reference voltage for each rank for sampling data from the DRAM 200 may be optimized. Accordingly, the integrity of data transmitted from the DRAM 200 may be improved.

Figure 3:
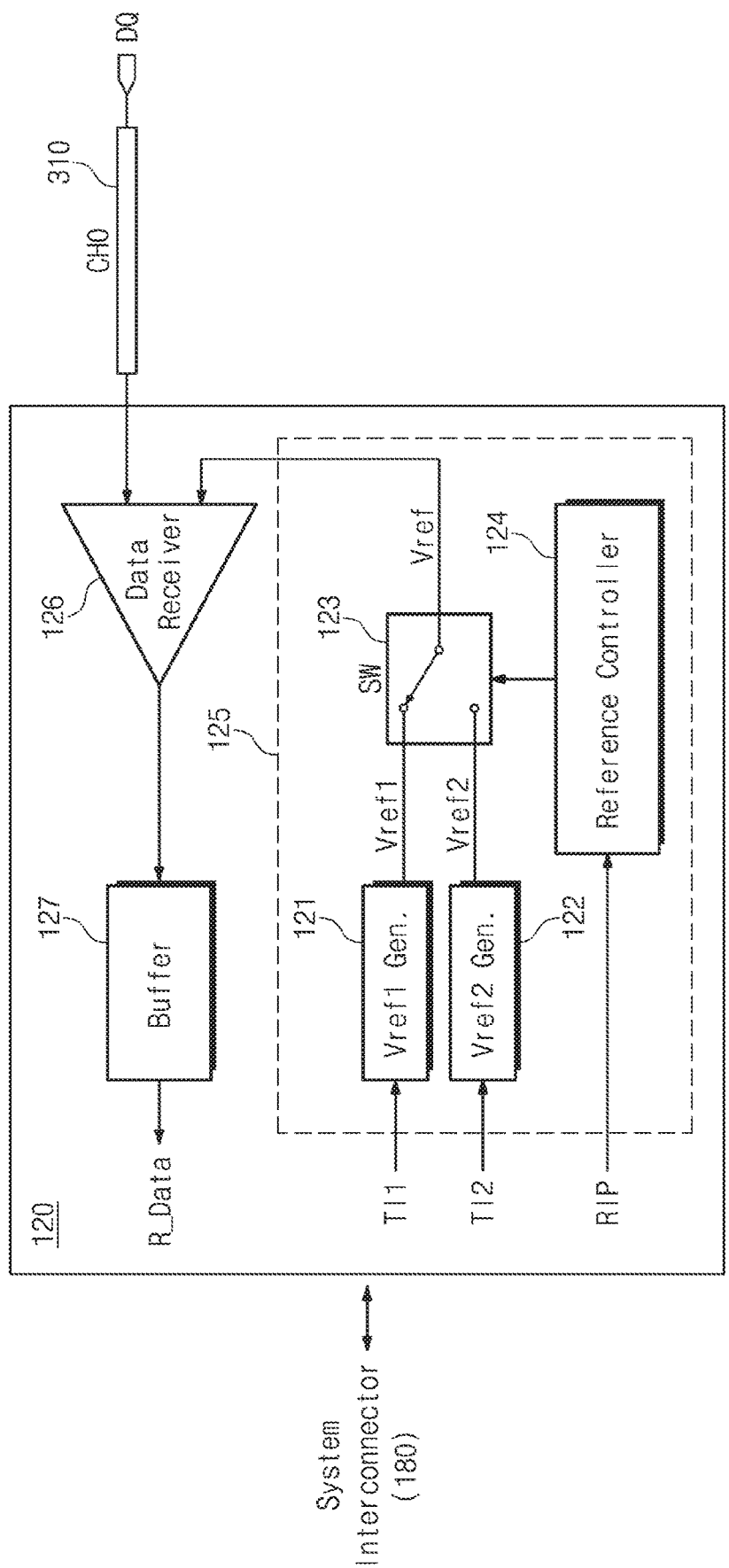
FIG. 3 is a block diagram illustrating a DRAM controller including a multi-reference generator illustrated in FIG. 2, according to an exemplary embodiment of the inventive concept.

FIG. 3 is a block diagram illustrating the DRAM controller including the multi-reference generator illustrated in FIG. 2, according to an exemplary embodiment of the inventive concept.

Referring to FIG. 3, in exemplary embodiments, the DRAM controller 120 includes the multi-reference generator 125, a data receiver 126 (also referred to herein as a data receiver circuit 126), and a buffer 127.

In exemplary embodiments, the multi-reference generator 125 includes at least two reference voltage generators 121 and 122 (also referred to herein as reference voltage generator circuits 121 and 122), a reference selection switch 123, and a reference controller 124 (also referred to herein as a reference voltage controller 124, or a reference voltage controller circuit 124). The reference voltage generators 121 and 122 respectively generate reference voltages Vref1 and Vref2, independently. For example, the first reference voltage generator 121 generates the first reference voltage Vref1, and the second reference voltage generator 122 generates the second reference voltage Vref2. The level of the second reference voltage Vref2 is independent of the level of the first reference voltage Vref1.

In exemplary embodiments, a level of the first reference voltage Vref1 that is an optimum value of a data signal level of a die corresponding to a first rank RANK0 is determined through a training operation of the DRAM 200. In this case, the first reference voltage generator 121 is set by training information TI1 to generate the first reference voltage Vref1 of the determined level. Similarly, a level of the second reference voltage Vref2 that is an optimum value of a data signal level of a die corresponding to a second rank RANK1 is determined through the training operation. The second reference voltage generator 122 is set by training information TI2 to generate the second reference voltage Vref2 of the determined level.

Subsequently, when the training operation ends and the rank interleaving mode of the DRAM 200 is resumed, the ranks RANK0 and RANK1 are alternately selected in units of a specified interleaving size upon writing data in the DRAM 200. Similarly, the ranks RANK0 and RANK1 are enabled at a specified rank interleaving period upon reading data from the DRAM 200. For example, in exemplary embodiments, in a read operation, the multi-reference generator 125 generates the read reference voltages Vref1 and Vref2 of different or independent levels in synchronization with a rank interleaving period RIP of the DRAM 200, and provides the read reference voltages Vref1 and Vref2 to the data receiver 126. The reference controller 124 controls the reference selection switch 123 with reference to information such as the rank interleaving period RIP. A reference voltage Vref (e.g., the first reference voltage Vref1 or the second reference voltage Vref2) selected by the reference selection switch 123 is provided to the data receiver 126.

In the read operation, the data receiver 126 receives read data transmitted through the first channel 310 from the DRAM 200. The read data is data output in a rank interleaving manner. The data receiver 126 may sample read data transmitted from the DRAM 200 with reference to the reference voltage Vref that is provided as an optimum value for each rank in synchronization with the rank interleaving period RIP. The read data R_DATA sampled by the data receiver 126 may be stored in the buffer 127, and then may be transferred as target block requesting data.

An exemplary configuration of the DRAM controller 120 including the multi-reference generator 125 is described above with reference to FIG. 3. However, a configuration or a control manner of the multi-reference generator 125 is not limited to the above description. For example, the configuration or the control manner of the multi-reference generator 125 may be variously changed according to exemplary embodiments of the inventive concept.

Figure 4:
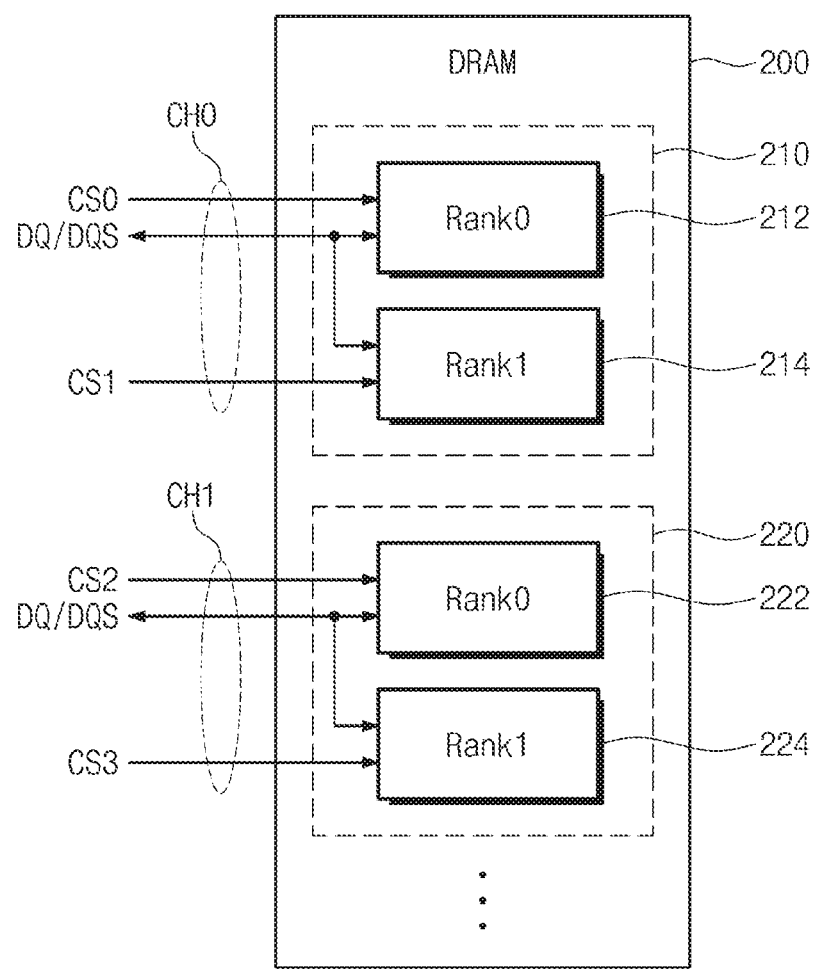
FIG. 4 is a block diagram illustrating channel and rank structures of a dynamic random access memory (DRAM) according to an exemplary embodiment of the inventive concept.

FIG. 4 is a block diagram illustrating channel and rank structures of the DRAM 200 according to an exemplary embodiment of the inventive concept.

Referring to FIG. 4, in exemplary embodiments, the DRAM 200 is connected with the DRAM controller 120 through a plurality of channels CH0, CH1, . . . , CHn–1 through which data exchange is independently performed. The channels CH0, CH1, . . . , CHn–1 are divided in units of ranks having different analog characteristics.

In exemplary embodiments, the DRAM 200 is managed by the DRAM controller 120 in the channel interleaving manner. For example, in a case in which the DRAM controller 120 writes data in the DRAM 200, write-requested data may be partitioned in an interleaving unit. Assuming that the interleaving unit IU is 128 bytes, write-requested data is partitioned in units of 128 bytes to respectively correspond to the channels CH0, CH1, . . . , CHn–1, and the partitioned data is written in the memory dies through the corresponding channels in a predetermined order. For example, assuming that a channel interleaving sequence is "CH0→CH1→CH2→CH3→ . . . →CHn–1", the partitioned data of the 128-byte interleaving unit IU may be transmitted to each channel in a pipeline manner. To output data in a read operation, channels may be selected in the same manner as described above. It is to be understood that partitioning the write-requested data in units of 128 bytes is exemplary, and that exemplary embodiments of the inventive concept are not limited thereto.

In addition, channels are interleaved in units of ranks. For example, if the channel CH0 including two ranks Rank0 and Rank1 is selected, the DRAM controller 120 activates a chip select signal (one of CS0 and CS1) for selecting one of the two ranks Rank0 and Rank1. Rank0 and Rank1 are included in a first portion 210 of the DRAM 200 that is accessed via the channel CH0. The first rank Rank0 includes a memory region 212, and the second rank Rank1 includes a memory region 214. Subsequently, the data signal DQ may be transferred in synchronization with the strobe signal DQS. In this case, a signal line for transferring the strobe signal DQS and the data signal DQ is shared by the two ranks Rank0 and Rank1, and one of the two ranks Rank0 and Rank1 is selected by the chip select signals CS0 and CS1.

Similarly, if the channel CH1 including two ranks Rank0 and Rank1 is selected, the DRAM controller 120 activates a chip select signal (one of CS2 and CS3) for selecting one of the two ranks Rank0 and Rank1. Rank0 and Rank1 are included in a second portion 220 of the DRAM 200 that is accessed via the channel CH1. The first rank Rank0 includes a memory region 222, and the second rank Rank1 includes a memory region 224. Subsequently, the data signal DQ may be transferred in synchronization with the strobe signal DQS. In this case, a signal line for transferring the strobe signal DQS and the data signal DQ is shared by the two ranks Rank0 and Rank1, and one of the two ranks Rank0 and Rank1 is selected by the chip select signals CS2 and CS3.

In exemplary embodiments, a die corresponding to each rank of the DRAM 200 adjusts a reference voltage for receiving write data provided from the system-on-chip 100. An optimum reference voltage for securing the integrity of write data is set through a write training operation.

Referring to a comparative example, in a DRAM controller of a system-on-chip, it may be difficult to set an optimized reference voltage for each rank in the read operation depending on rank interleaving. Referring to exemplary embodiments of the present inventive concept, the DRAM controller 120 includes the multi-reference generator 125, which provides a reference voltage of an independent level for the purpose of sampling read data. In exemplary embodiments, the multi-reference generator 125 is set to detect an optimum reference voltage for each rank in software training, and to generate the optimum reference voltage for each rank thus detected.

Figure 5:
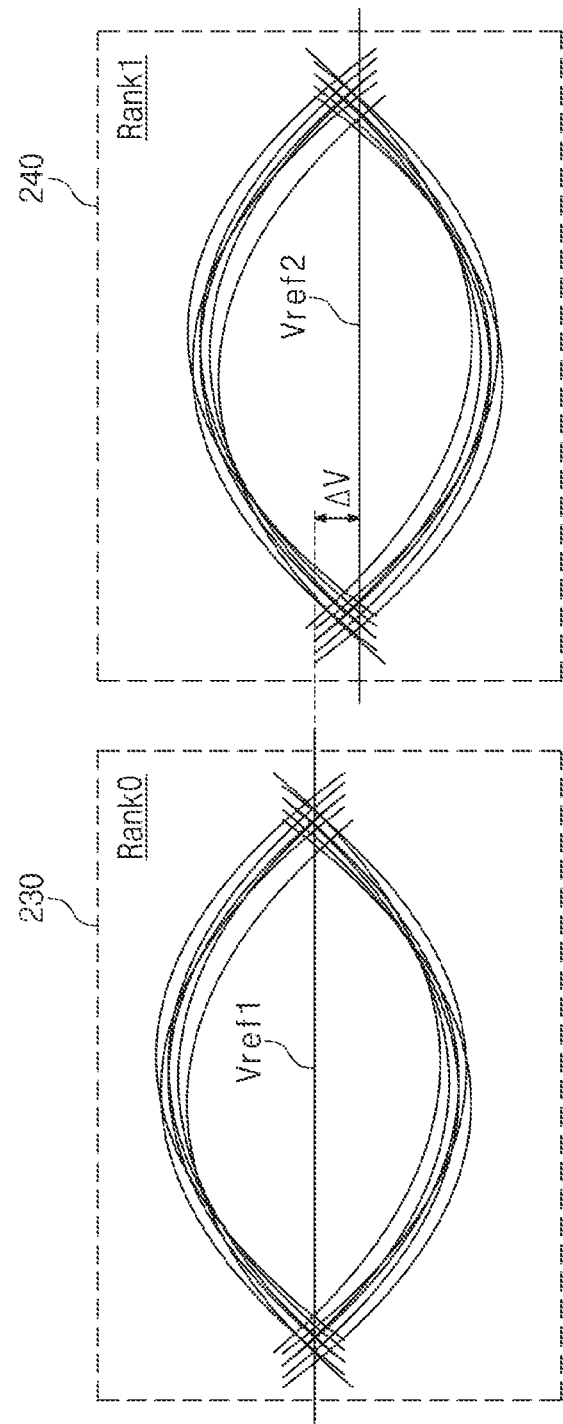
FIG. 5 is a view illustrating a characteristic of a multi-reference generator according to an exemplary embodiment of the inventive concept.

FIG. 5 is a view illustrating a characteristic of a multi-reference generator according to an exemplary embodiment of the inventive concept.

Referring to FIG. 5, eye patterns 230 and 240 of data signals respectively output by the first and second ranks Rank0 and Rank1 of the DRAM 200 are illustrated. For convenience of explanation, a description associated with a training operation of detecting the center in a unit interval UI of each of the eye patterns 230 and 240 is omitted. It is assumed that the training operation for detecting the center has already been completed upon performing training by using a training code loaded to the SRAM 160.

The eye pattern 230 shows a signal characteristic of output data of a memory die corresponding to the first rank Rank0 connected to the channel CH0 of the DRAM 200. The eye pattern 240 shows a signal characteristic of output data of a memory die corresponding to the second rank Rank1 connected to the channel CH0 of the DRAM 200. It is to be understood from the eye patterns 230 and 240 that a level of a reference voltage for securing the integrity of read data varies for each rank.

If data transmitted from the DRAM 200 is sampled in the system-on-chip 100 only using the reference voltage Vref1, the integrity of read data of the first rank Rank0 may be secured. However, the optimum reference voltage Vref2 of data output from the second rank Rank1 has a voltage difference ΔV with respect to the reference voltage Vref1. Accordingly, it may be difficult to secure the integrity of data output from the second rank Rank1.

The system-on-chip 100 according to exemplary embodiments of the inventive concept detects an optimum reference voltage for each rank through the training operation. The system-on-chip 100 according to exemplary embodiments of the inventive concept provides the optimum reference voltage for each rank using the multi-reference generator 125. When training is completed, in a read operation, the system-on-chip 100 may switch a reference voltage for data output from the DRAM 200 in synchronization with the rank interleaving period RIP.

Figure 6:
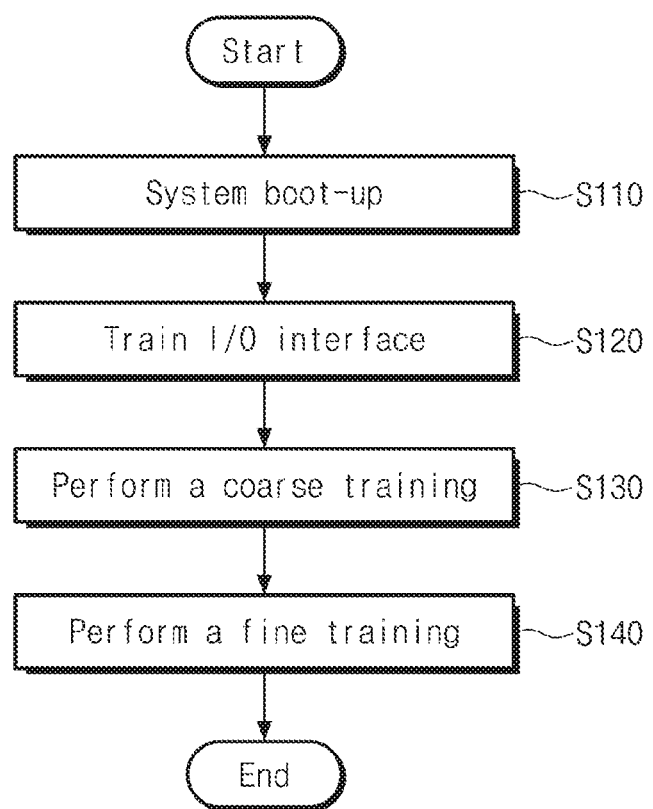
FIG. 6 is a flowchart illustrating a software training method of a DRAM according to an exemplary embodiment of the inventive concept.

FIG. 6 is a flowchart illustrating a software training method of a DRAM according to an exemplary embodiment of the inventive concept.

Referring to FIG. 6, a software training operation of the DRAM 200 includes a coarse training operation and a fine training operation. The coarse training operation relates to the procedure of loading and executing a training code to the SRAM 160 (refer to FIG. 2), and the fine training operation relates to the procedure of loading and executing the training code to the DRAM 200.

In operation S110, the electronic device 10 is booted up. For example, the booting operation may be performed when a power switch of the electronic device 10 is turned on or when initialization is performed by a device reset.

In operation S120, training is performed on overall input/output interfaces of the electronic device 10. Before actual training is performed on the DRAM 200, training operations for securing minimum reliability may be performed in operation S120. In exemplary embodiments, the procedure of training input/output interfaces may be omitted.

In operation S130, the coarse training operation is performed on the DRAM 200. For the coarse training operation, the system-on-chip 100 loads a training code to the SRAM 160. The minimum reliability for access to the DRAM 200 may be secured by using the training code loaded to the SRAM 160. For example, a delay of a data signal and control signals of the DRAM 200 or a center value of a data signal window may be adjusted through the coarse training operation.

In operation S140, the fine training operation for determining a fine operation parameter is performed on the DRAM 200. In an exemplary embodiment, the fine training operation is an operation for adjusting a parameter determined by the coarse training operation more finely. Alternatively, in an exemplary embodiment, the fine training operation is a software training operation for determining a different type of operation parameter from the coarse training operation. The training code TC provided for the fine training operation may have a relatively large size. Accordingly, the training code TC for performing the fine training operation may be loaded to any one of the ranks of the DRAM 200. To this end, for the fine training, the rank interleaving of the DRAM 200 may be disabled, or the size of an interleaving unit may be adjusted. If the fine training operation is completed, the system-on-chip 100 may disable the rank interleaving and may store parameter information (including a reference voltage for each rank) obtained through training in the storage device 170.

Subsequently, in a reset situation, training for the DRAM 200 may be skipped, and initialization may be performed using the parameter information stored in the storage device 170. For example, the parameter obtained as a result of the training operation and stored in the storage device 170 may be used to skip the software training procedure in the following reset operation.

According to exemplary embodiments of the inventive concept, the training code TC is loaded to the DRAM 200 targeted for training instead of the SRAM 160. Accordingly, the limitation on the size of the training code TC that would exist if the training code TC was being loaded to the SRAM 160 is removed, thereby allowing for the implementation of improved software training (e.g., with respect to various functions and performance). In addition, since the training code TC is loaded to the DRAM 200, the speed of which is higher than that of the SRAM 160 that is accessed through the system interconnector 180 or a bus, the time taken to load and fetch the training code TC is shortened. Accordingly, the software training speed of the DRAM 200 is increased according to exemplary embodiments.

Figure 7:
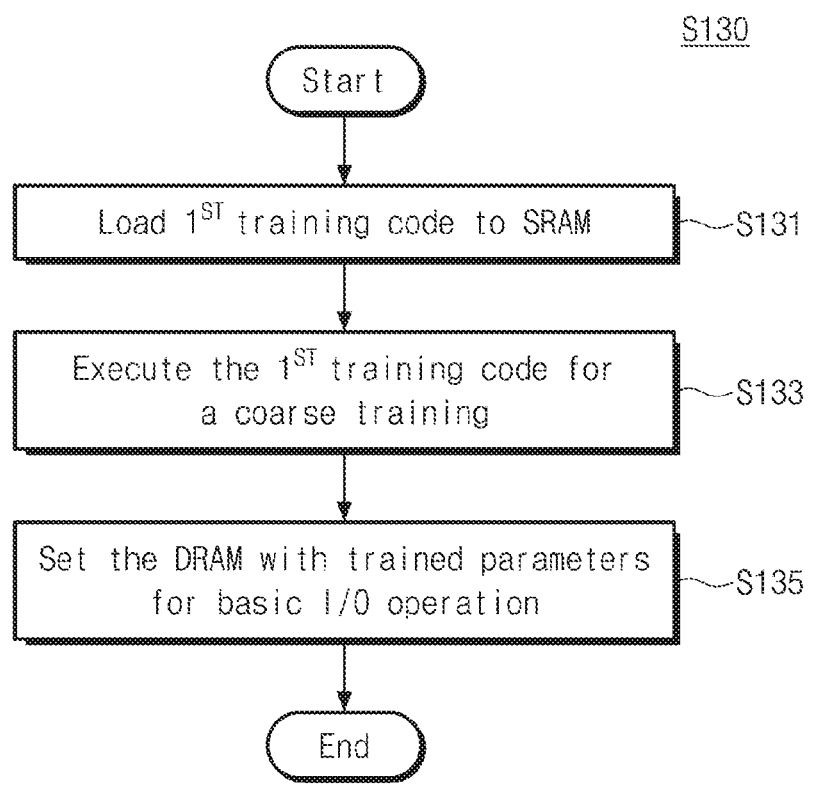
FIG. 7 is a flowchart illustrating a coarse training procedure of FIG. 6 according to an exemplary embodiment of the inventive concept.

FIG. 7 is a flowchart illustrating the coarse training procedure of FIG. 6 according to an exemplary embodiment of the inventive concept.

Referring to FIG. 7, the coarse training operation (operation S130) of the DRAM 200 is performed by loading a training code TC to the SRAM 160.

In operation S131, the system-on-chip 100 loads a first training code TC to the SRAM 160 for the purpose of performing coarse training on the DRAM 200. The first training code TC may be a training code TC for basic settings for inputting/outputting data to/from the DRAM 200. For example, a delay of a data signal and control signals of the DRAM 200 or a center value of a data signal window may be adjusted through the coarse training operation.

In operation S133, the system-on-chip 100 executes the first training code TC loaded to the SRAM 160. An overall training sequence for detecting states of the data signal and control signals of the DRAM 200 may be included in the first training code TC. For example, as the first training code TC is executed, a parameter of a basic input/output path of the DRAM 200 or delay states of a clock signal may be detected. The system-on-chip 100 may determine a delay value of a clock, a data strobe signal DQS, or a data signal DQ, based on the detection result.

In operation S135, the system-on-chip 100 sets the DRAM 200 using the parameter determined by the execution of the first training code TC. For example, an operating characteristic(s) of the DRAM 200 is set using the parameter determined by the execution of the first training code TC. The DRAM 200 that is set using the parameter determined by the execution of the first training code TC may be in a state in which basic data input/output is possible.

A coarse training procedure according to an exemplary embodiment of the inventive concept is described above with reference to FIG. 6. However, the manner in which coarse training is performed is not limited to the above description. For example, in exemplary embodiments, the coarse training manner and the fine training manner may be changed to training manners targeted for different parameters of the DRAM 200. For example, if the coarse training operation relates to an operation for detecting an optimum value of a parameter associated with a clock or a delay of the DRAM 200, the fine training operation to be described later may relate to a training operation for optimizing a level of a signal.

Figure 8:
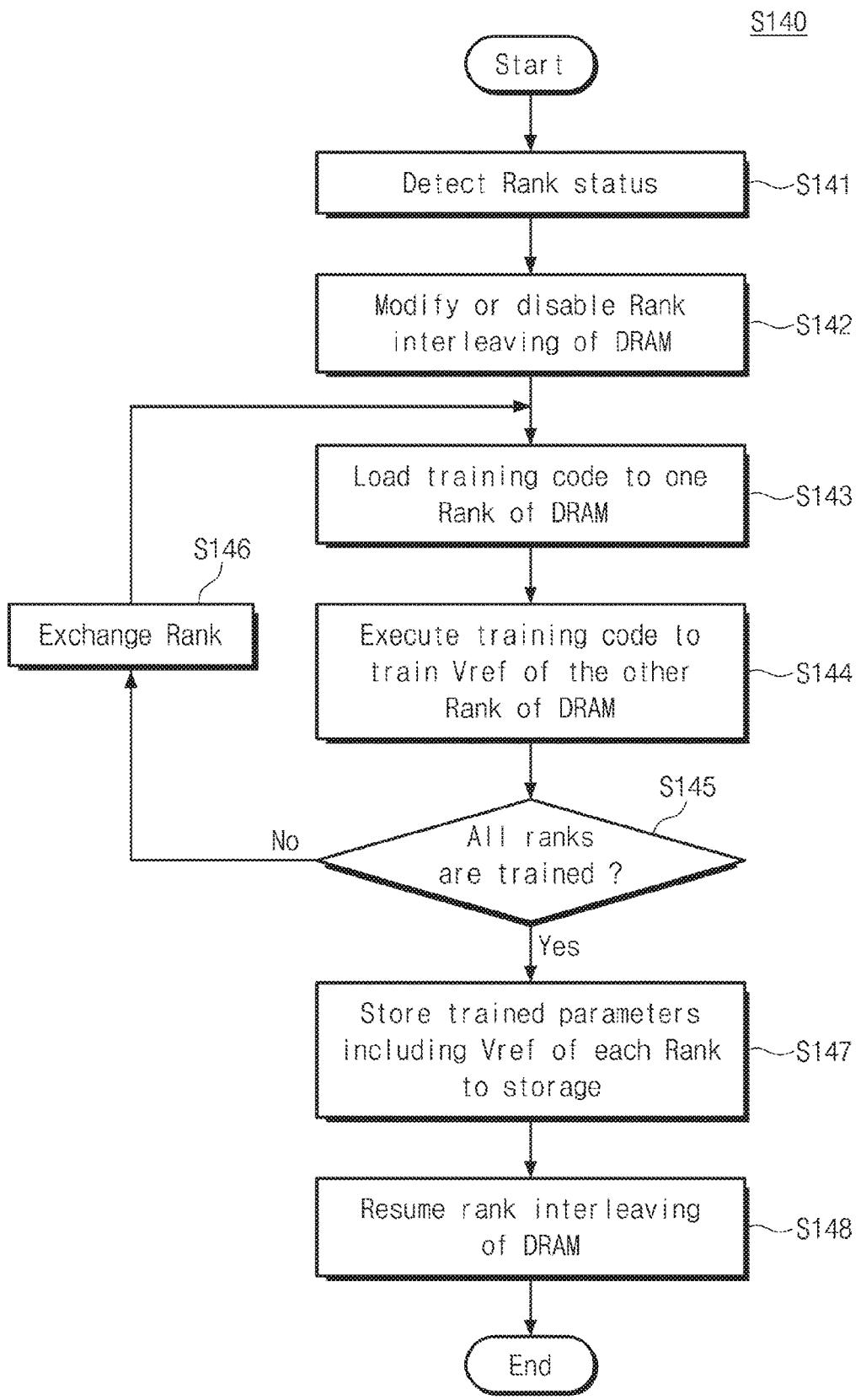
FIG. 8 is a flowchart illustrating a detailed procedure of a fine training operation of FIG. 6 according to an exemplary embodiment of the inventive concept.

FIG. 8 is a flowchart illustrating a detailed procedure of the fine training operation (operation S140) of FIG. 6 according to an exemplary embodiment of the inventive concept.

Referring to FIG. 8, a second training code TC is loaded to the DRAM 200 in the fine training operation. In exemplary embodiments, to load the second training code TC to the DRAM 200, the rank interleaving of the DRAM 200 is disabled or the size of the rank interleaving is adjusted.

In operation S141, the system-on-chip 100 detects a rank status of the DRAM 200. For example, the system-on-chip 100 may read ID information or serial presence detect (SPD) information of the DRAM 200, and may check the rank status of the DRAM 200 based on the read information. For example, the system-on-chip 100 detects the number of ranks of the DRAM 200 assigned to one channel.

To load a training code TC (e.g., the second training code TC) to the DRAM 200, in operation S142, the system-on-chip 100 may disable a rank interleaving mode or may adjust the size of an interleaving unit. For example, in a case in which two ranks are assigned to one channel, if the rank interleaving mode is disabled, one rank is expressed with a continuous address in a memory map of the DRAM 200. For example, the system-on-chip 100 may write the second training code TC only in a memory region corresponding to any one rank without partitioning the second training code TC. Alternatively, if the rank interleaving size is adjusted, the size of the interleaving unit may increase. In this case, the size of the interleaving unit may be determined to be large enough to load the whole second training code TC.

In operation S143, the system-on-chip 100 loads the second training code TC to the DRAM 200 in a rank interleaving disable/adjustment state. For example, the system-on-chip 100 loads the second training code TC to the DRAM 200 while the rank interleaving mode is disabled or while the size of the interleaving unit is adjusted. The system-on-chip 100 loads the second training code TC to a memory region corresponding to one rank. Here, the number of ranks included in each channel of the DRAM 200 may be various. However, for convenience of explanation, it is assumed that the number of ranks included in one channel is 2.

In operation S144, the system-on-chip 100 may access the rank to which the second training code TC is loaded, may fetch the second training code TC, and may execute the fetched second training code TC. For example, the CPU 110 performing the training operation may fetch and execute the second training code TC of the DRAM 200. As the second training code TC is executed, training may be performed on a memory region included in at least one rank to which the second training code TC is not loaded, or on a die to which the second training code TC is not loaded. For example, in a case in which the second training code TC is loaded to the first rank Rank0, training may be performed on a die or a memory region corresponding to the second rank Rank1. Training data may be written and read to and from the second rank Rank1. The system-on-chip 100 may evaluate the read training data to determine an optimum parameter. For example, the system-on-chip 100 according to exemplary embodiments of the inventive concept may detect a signal level of output data signal of the DRAM 200 through a read training operation of the DRAM 200. The optimum reference voltage Vref for each rank may be determined according to the signal level of the output data.

In operation S145, the system-on-chip 100 determines whether all ranks of the DRAM 200 have been trained. For example, the system-on-chip 100 may determine whether software training associated with all channels included in the DRAM 200 and all ranks of the channels is completed. If a rank to be trained exists (No), the procedure proceeds to operation S146. Alternatively, if all ranks have been trained (Yes), the process proceeds to operation S147.

In operation S146, the system-on-chip 100 newly selects a target rank to be trained. For example, in a case in which only two ranks exist, a rank to which a training code is previously loaded may be set as a target rank for training. Once the target rank for training has been selected, the procedure proceeds to operation S143 to perform training on the target rank.

In operation S147, the system-on-chip 100 stores operation parameters obtained as a result of the training operation in the storage device 170. For example, the system-on-chip 100 selects the reference voltage Vref for each rank and stores the selected reference voltage Vref for each rank in the storage device 170.

In operation S148, the system-on-chip 100 resumes the rank interleaving of the DRAM 200 if it was previously disabled (e.g., re-enables the rank interleaving of the DRAM 200) in operation S142, or returns the size of the interleaving unit to its previous size before the interleaving unit was adjusted if it was adjusted in operation S142. For example, the system-on-chip 100 may reset the electronic device 10 and may set the DRAM 200 using the parameter(s) obtained as the training result. In this case, the rank interleaving of the DRAM 200 is re-enabled.

The fine training procedure according to an exemplary embodiment of the inventive concept is described above. In the above description, rank interleaving is disabled in the fine training operation. However, exemplary embodiments of the inventive concept are not limited thereto. For example, in exemplary embodiments, channel interleaving is also disabled.

Figure 9:
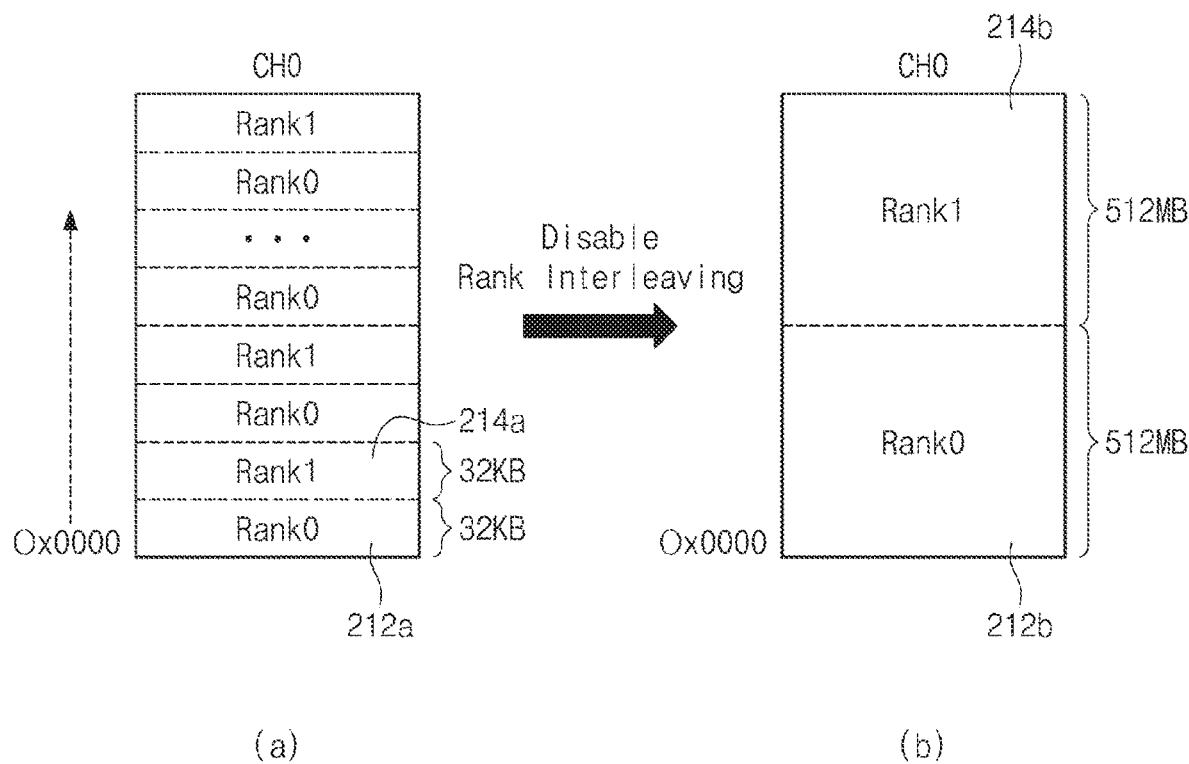
FIG. 9 is a view illustrating a memory map for describing an effect obtained upon disabling rank interleaving of a DRAM according to an exemplary embodiment of the inventive concept.

FIG. 9 is a view illustrating a memory map for describing an effect obtained upon disabling rank interleaving of a DRAM according to an exemplary embodiment of the inventive concept.

Referring to FIG. 9, each channel of the DRAM 200 is composed of a plurality of ranks, which are accessed in a rank interleaving manner. If rank interleaving is disabled, a memory map of the DRAM 200 may be accessed using a continuous address.

Referring to the memory map (a) corresponding to a state in which rank interleaving is enabled, data is written to or read from the DRAM 200 using the interleaving unit IU. For example, in the case of writing data, one piece of data is partitioned into the interleaving units IU, and the partitioned data of the interleaving units is scattered into and written in ranks, respectively. For example, in a case in which 64 KB of data is written through the channel CH0, the 64 KB of data may be partitioned into two pieces of 32 KB data. The partitioned pieces of 32 KB of data may be sequentially written in a memory region 212a of the first rank Rank0, and a memory region 214a of the second rank Rank1. The ranks Rank0 and Rank1 may correspond to different DRAM chips (or dies), respectively. In a case in which two ranks Rank0 and Rank1 are included in the channel CH0, the ranks Rank0 and Rank1 may be alternately selected according to an interleaving sequence in an operation of writing data. In a read operation, ranks may be selected in the same manner as described above, and data read from the ranks selected in the interleaving manner may be transferred to the system-on-chip 100.

However, if rank interleaving is disabled, a memory region of the channel CH0 is mapped as illustrated in the memory map (b). If rank interleaving is disabled, the interleaving unit IU is not utilized. For example, if rank interleaving is disabled, write data may be continuously written in a selected memory region or a selected chip (or die). For example, it is assumed that a memory region corresponding to each of the first rank Rank0 and the second rank Rank1 is 512 MB. In this case, in the memory map (b), a memory region 212b corresponding to the first rank Rank0 may be mapped using continuous addresses, and a memory region 214b corresponding to the second rank Rank1 may be mapped using continuous addresses. Accordingly, in exemplary embodiments, even though a training code TC having a size that is larger than the interleaving unit (e.g., 32 KB) is written in the DRAM 200, the training code TC may be stored in one rank without scattering.

As described above, according to exemplary embodiments of the inventive concept, after rank interleaving is disabled, a training code TC may be loaded to one rank, and training may be performed on the other rank.

Figure 10:
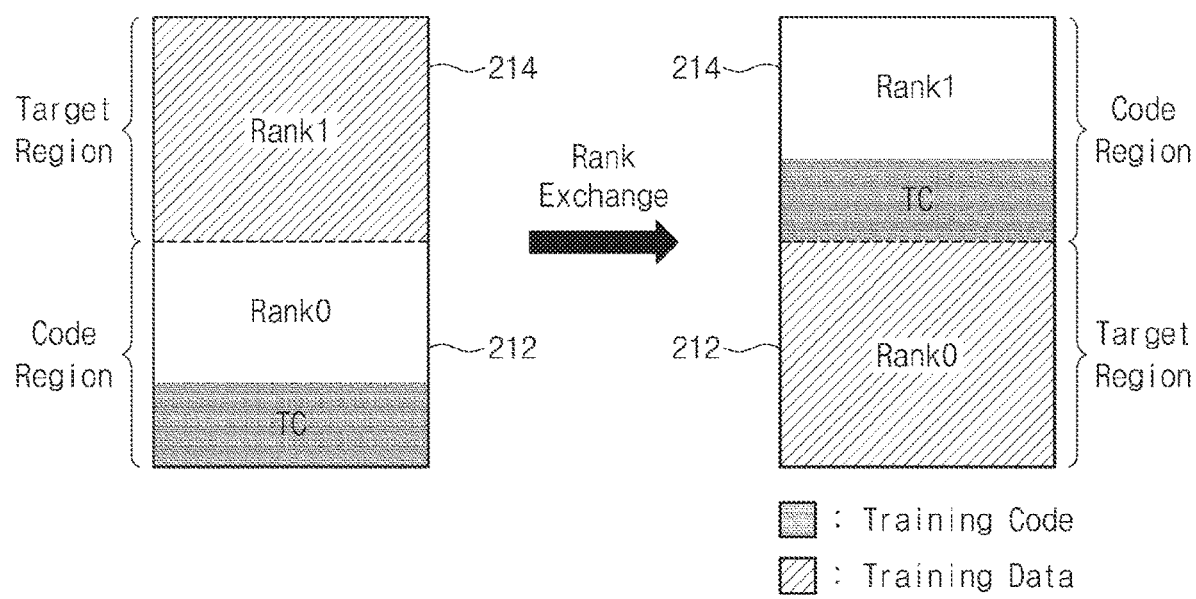
FIG. 10 is a view illustrating a method of loading a training code and training data to a DRAM when rank interleaving of the DRAM is disabled, according to an exemplary embodiment of the inventive concept.

FIG. 10 is a view illustrating a method of loading the training code TC and training data to the DRAM 200 when rank interleaving is disabled.

Referring to FIG. 10, the training code TC may be loaded at least two times to respective ranks of the DRAM 200, the rank interleaving of which is disabled.

First, to train the second rank Rank1, the training code TC is loaded to the first rank Rank0. The training code TC may be written in a part of the memory region 212 of the first rank Rank0. For example, the memory region 212 of the first rank Rank0 may be assigned to a code region to which the training code TC is loaded, and the memory region 214 of the second rank Rank1 may be assigned to a target region to which training data is loaded. In this state, as the training code TC is executed, training may be performed on the second rank Rank1. In this case, in exemplary embodiments, the optimum reference voltage Vref2 for sampling data output from the second rank Rank1 is detected.

After rank exchange, to train the first rank Rank0, the training code TC is loaded to the second rank Rank1. The training code TC may be written in a part of the memory region 214 of the second rank Rank1. For example, the memory region 214 of the second rank Rank1 may be assigned to a code region to which the training code TC is loaded, and the memory region 212 of the first rank Rank0 may be assigned to a target region to which training data is loaded. In this state, as the training code TC is executed, training is performed on the first rank Rank0. In this case, the optimum reference voltage Vref1 for sampling data output from the first rank Rank0 is detected.

Figure 11:
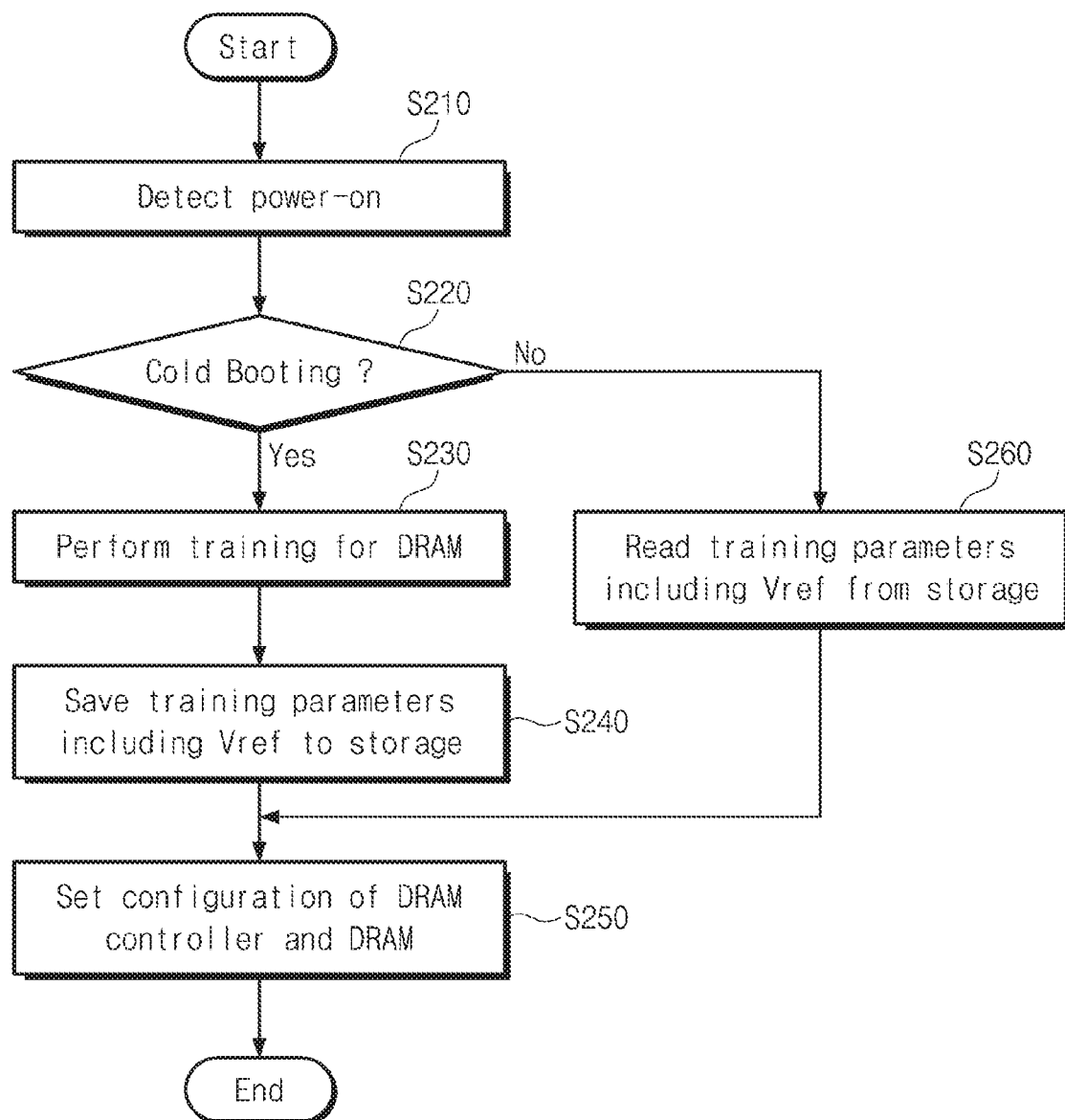
FIG. 11 is a flowchart illustrating a booting operation of an electronic device including a DRAM controller performing a training operation, according to an exemplary embodiment of the inventive concept.

FIG. 11 is a flowchart illustrating a booting operation of the electronic device 10 including a DRAM controller performing a training operation, according to an exemplary embodiment of the inventive concept.

Referring to FIG. 11, the electronic device 10 according to an exemplary embodiment of the inventive concept sets an operation parameter of the DRAM 200 using a value stored in the storage device 170, without performing software training in a situation such as a reset situation. Accordingly, the electronic device 10 is booted up at high speed.

In operation S210, the electronic device 10 detects a power-on state. For example, the electronic device 10 detects power-on according to a forcible reset by a user or power-on according to a reset request of a system.

In operation S220, the electronic device 10 determines whether a booting procedure currently being performed corresponds to cold booting. For example, the electronic device 10 may determine whether current booting is cold booting starting after power is interrupted, or hot booting in which overall operation states of the electronic device 10 are reset while power is maintained. In the case in which the current booting corresponds to the cold booting (Yes), the procedure proceeds to operation S230. Alternatively, in the case in which the current booting does not correspond to the cold booting (No), the procedure proceeds to operation S260.

In operation S230, the electronic device 10 performs a training operation for determining or adjusting overall operation parameters of the DRAM 200. The training operation S230 may include the coarse training operation and the fine training operation described above. The electronic device 10 may determine and set values of a data signal, a control signal, and a clock signal of the DRAM 200 through the training operation. In addition, the electronic device 10 may perform the training operation to determine the above-described reference voltages Vref1 and Vref2 for each rank for sensing output data of the DRAM 200.

In operation S240, the electronic device 10 saves (or stores) the training parameters obtained as a result of the training operation in the storage device 170. The training parameters stored in the storage device 170 include the reference voltages Vref1 and Vref2 for each rank.

In operation S250, the electronic device 10 sets the configuration of the DRAM 200 and the DRAM controller 120 using the training parameters obtained as a result of the training operation. For example, the electronic device 10 may set operation parameters within the DRAM 200 through a write training operation for the DRAM 200. In addition, the electronic device 10 may set levels of the reference voltages Vref1 and Vref2 generated in the DRAM controller 120 through a read training operation for the DRAM 200.

In operation S260, the electronic device 10 accesses the storage device 170 in which the training result value(s) of the DRAM 200 is stored (or saved). The electronic device 10 reads the training result value(s) from the storage device 170. Then, the electronic device 10 sets the configuration of the DRAM 200 and the DRAM controller 120 (e.g., sets the operating characteristics of the DRAM 200 and the DRAM controller 120). In this case, levels of the reference voltages Vref1 and Vref2 generated by the multi-reference generator 125 included in the DRAM controller 120 may also be set.

The booting procedure of the electronic device 10 according to exemplary embodiments of the inventive concept is described above. Training may be performed on the DRAM 200 in a cold booting situation in which operation parameters of the DRAM 200 are newly determined. It may take a relatively long time to perform training on the DRAM 200 in certain situations. Thus, the electronic device 10 may skip a training procedure in some situations other than a cold booting situation, such as a reset situation or a forcible initialization situation. The training procedure may be skipped because optimum operation parameters obtained through a training operation are already stored in the storage device 170.

Figure 12:
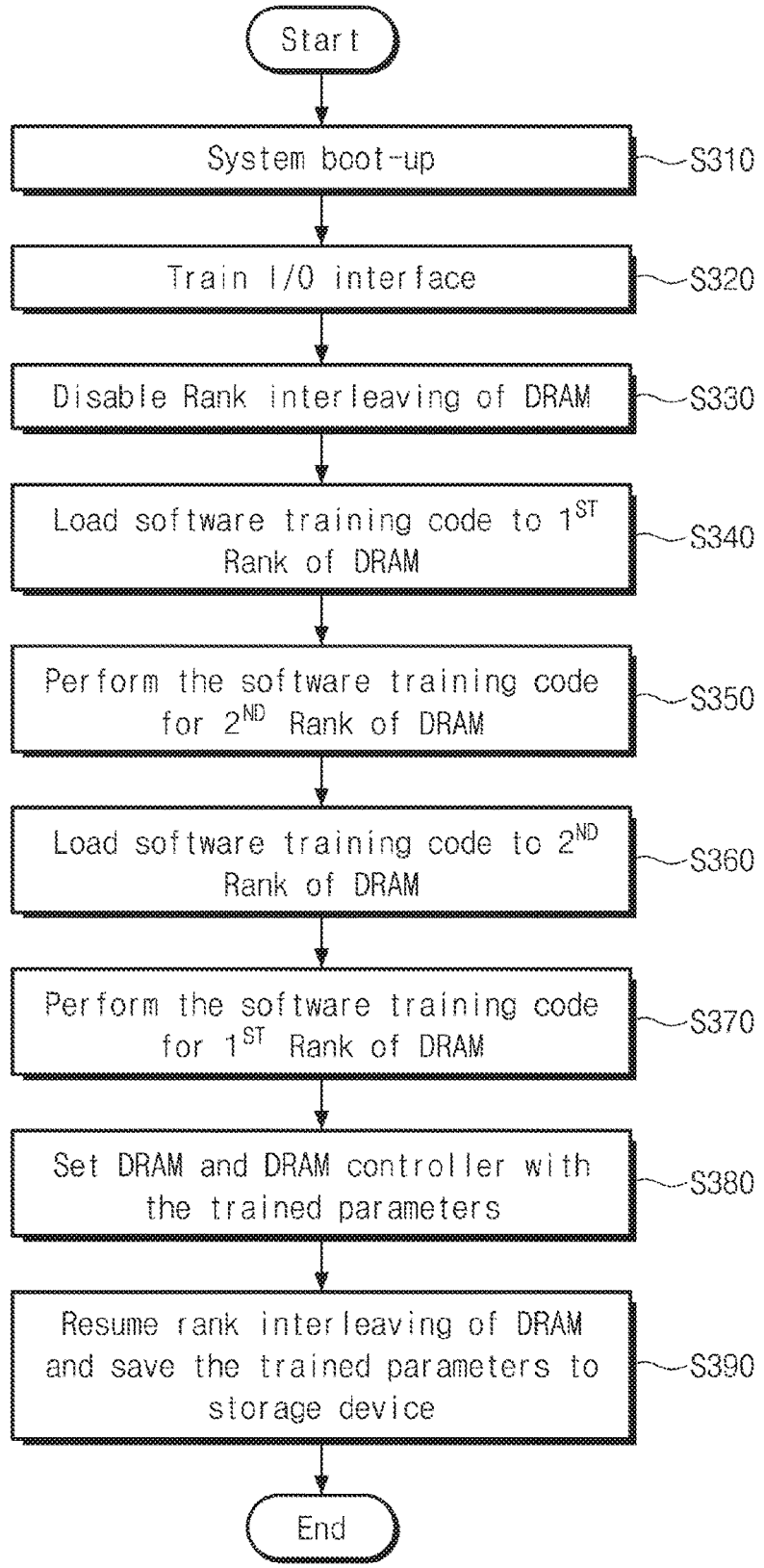
FIG. 12 is a flowchart illustrating a training operation of a memory device according to an exemplary embodiment of the inventive concept.

FIG. 12 is a flowchart illustrating a training operation of a memory device according to an exemplary embodiment of the inventive concept. Referring to FIG. 12, the DRAM 200 according to exemplary embodiments of the inventive concept may be trained without using the SRAM 160. For example, in an exemplary embodiment, a training code TC for training the DRAM 200 is loaded only to the DRAM 200.

In operation S310, the electronic device 10 is booted up. For example, a power switch of the electronic device 10 may be turned on, or a booting operation may be performed when an initialization operation is performed by a hardware reset.

In operation S320, training is performed on overall input/output interfaces of the electronic device 10. Before training is performed on the DRAM 200, training operations for securing minimum reliability may be performed in operation S320. In an exemplary embodiment, the procedure of training input/output interfaces may be omitted.

In operation S330, the system-on-chip 100 disables a rank interleaving mode of the DRAM 200. Alternatively, the system-on-chip 100 adjusts the data size for rank interleaving of the DRAM 200. As described above, according to exemplary embodiments of the inventive concept, when rank interleaving is disabled, the whole training code TC may be loaded to one rank of the DRAM 200. In addition, even though the size of the interleaving unit set to rank interleaving is adjusted to be larger than the size of the training code TC, the whole training code TC may be stored in one rank.

In operation S340, the system-on-chip 100 loads the training code TC to the first rank Rank0 of the DRAM 200. Here, for convenience of description, it is assumed that the number of ranks included in each channel of the DRAM 200 is 2.

In operation S350, the system-on-chip 100 accesses the first rank Rank0 to which the training code TC is loaded, fetches the training code TC, and executes the fetched training code TC. For example, the CPU 110 performing the training operation may fetch and execute training code TC of the DRAM 200. As the training code TC is executed, training may be performed on a memory region included in the second rank Rank1 to which the training code TC is not loaded, or on a die to which the training code TC is not loaded. Training data may be written to and read from a memory region of the second rank Rank1. The system-on-chip 100 may evaluate the read training data to determine an optimum parameter. For example, the system-on-chip 100 according to exemplary embodiments of the inventive concept may detect a signal level of an output data signal of the DRAM 200 through a read training operation of the DRAM 200. The optimum reference voltage Vref for each rank may be determined according to the signal level of the output data.

In operation S360, the system-on-chip 100 loads the training code TC to the second rank Rank1 of the DRAM 200.

In operation S370, the system-on-chip 100 accesses the second rank Rank1 to which the training code TC is loaded, fetches the training code TC, and executes the fetched training code TC. As the training code TC is executed, training may be performed on a memory region included in the first rank Rank0 to which the training code TC is not loaded, or on a die to which the training code TC is not loaded. Training data may be written to and read from a memory region of the first rank Rank0. The system-on-chip 100 may evaluate the read training data to determine an optimum parameter. For example, the optimum reference voltage Vref of the first rank Rank0 may be determined from the read training data.

In operation S380, the system-on-chip 100 sets the configuration of the DRAM 200 and the DRAM controller 120 using the training parameters determined through the training operation. For example, a reference voltage of write data may be set for each rank included in the DRAM 200. Also, levels of the reference voltages Vref1 and Vref2 generated by the multi-reference generator 125 included in the DRAM controller 120 may be set.

In operation S390, the system-on-chip 100 resumes an interleaving operation mode of the DRAM 200. Further, the system-on-chip 100 stores (or saves) operation parameters obtained as the training result in the storage device 170. The system-on-chip 100 stores the reference voltages Vref1 and Vref2 for each rank of the DRAM 200 in the storage device 170. The parameters stored in the storage device 170 may be used to subsequently initialize the DRAM 200 and the DRAM controller 120 without a training procedure in a reset or hot booting operation.

An exemplary embodiment in which a training method does not use the SRAM 160 is described above with reference to FIG. 12. For example, in the case of a system-on-chip 100 provided for a specific purpose that includes the SRAM 160 having a capacity that is not large enough to store a training code TC, the reliability of the DRAM 200 may be secured by using the training method according to the exemplary embodiment described with reference to FIG. 12.

Figure 13:
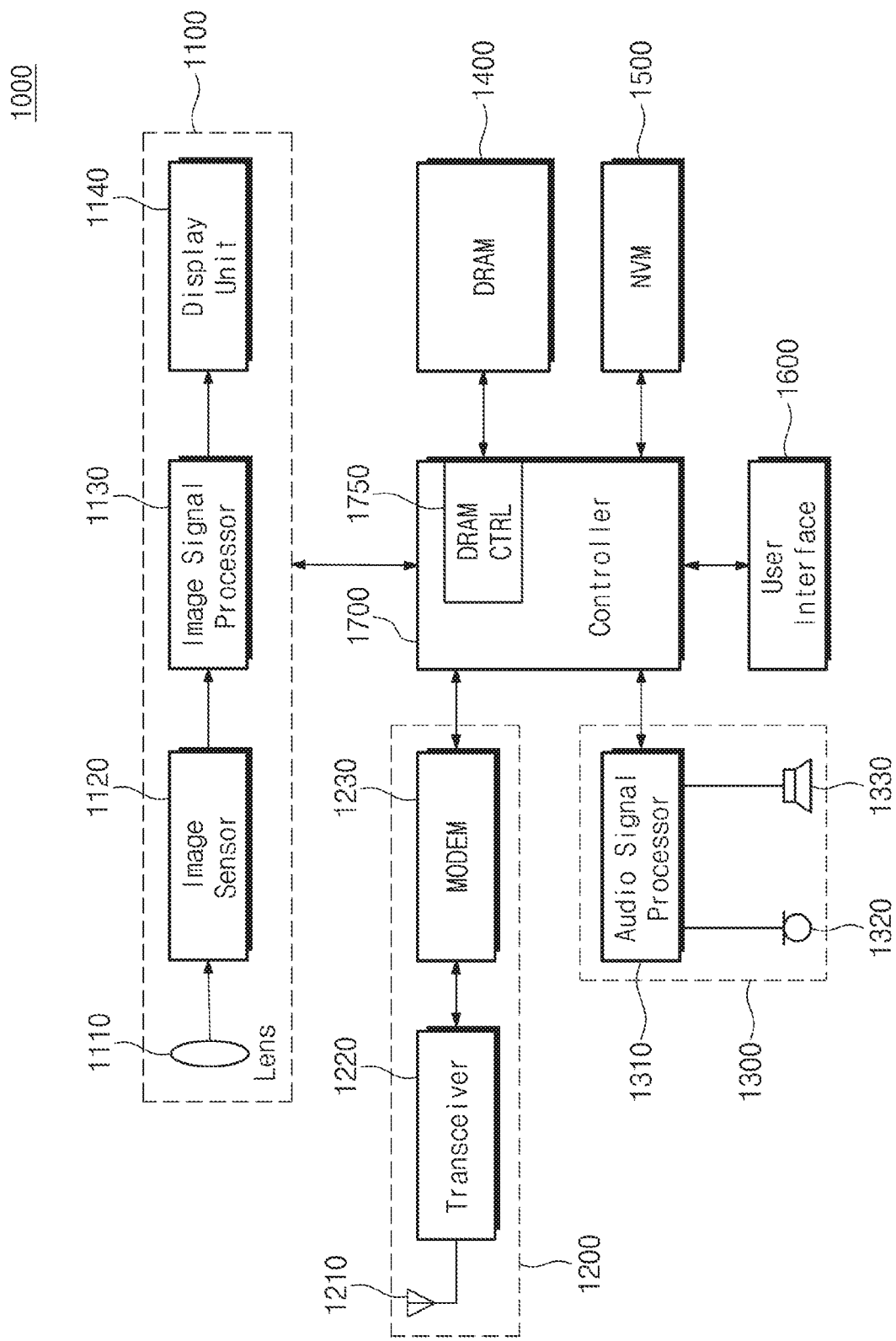
FIG. 13 is a block diagram illustrating a portable terminal according to an exemplary embodiment of the inventive concept.

FIG. 13 is a block diagram illustrating a portable terminal according to an exemplary embodiment of the inventive concept.

Referring to FIG. 13, a portable terminal 1000 according to an exemplary embodiment of the inventive concept includes an image processing unit 1100, a wireless transceiver unit 1200, an audio processing unit 1300, a DRAM 1400, a nonvolatile memory device 1500, a user interface 1600, and a controller 1700.

The image processing unit 1100 includes a lens 1110, an image sensor 1120, an image signal processor 1130, and a display unit 1140. The wireless transceiver unit 1210 includes an antenna 1210, a transceiver 1220, and a modulator/demodulator (modem) 1230. The audio processing unit 1300 includes an audio processor 1310, a microphone 1320, and a speaker 1330.

Here, the controller 1700 may include the same components as the system-on-chip 100 of FIG. 1. For example, the controller 1700 may include a DRAM controller 1750 for data exchange with the DRAM 1400. The DRAM controller 1750 may access the DRAM 1400 using a rank interleaving mode. The controller 1700 may adjust a parameter for communication with the DRAM 1400 through software training. For example, in the software training, the controller 1700 may disable rank interleaving, may load a training code only to one rank, and may perform training on the other rank, as described above. Through the above-described training operation, a reference voltage for each rank may be optimized in a multi-reference generator included in the DRAM controller 1750.

According to exemplary embodiments of the inventive concept, a training code for training of a DRAM may be executed after being loaded to the DRAM. Accordingly, memory training of higher reliability may be implemented without restricting the size of the training code. In addition, an electronic device having high integrity of data may be implemented by configuring a system-on-chip capable of training a reference voltage for each rank for sampling output data of the DRAM.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An electronic device, comprising:
   a memory device comprising a first rank and a second rank; and
   a system-on-chip that exchanges data with the memory device,
   wherein the system-on-chip performs a first training operation on the first rank to adjust a first reference voltage for sampling output data of the first rank, and a second training operation on the second rank to adjust a second reference voltage for sampling output data of the second rank.

2. The electronic device of claim 1, wherein the system-on-chip loads a first training code to an SRAM to perform a third training operation on the memory device.

3. The electronic device of claim 2, wherein the system-on-chip executes the first training code to perform the third training operation, and sets the basic data input/output parameters of the memory device based on a result of the third training operation.

4. The electronic device of claim 1, wherein the system-on-chip loads a first training code to the second rank and performs the first training operation on the first rank using the first training code loaded to the second rank, and
   wherein the system-on-chip loads a second training code to the first rank and performs the second training operation on the second rank using the second training code loaded to the first rank.

5. The electronic device of claim 4, wherein, before performing the first and second training operations, the system-on-chip disables or adjusts a rank interleaving mode of the memory device.

6. The electronic device of claim 1, wherein the system-on-chip comprises:
   a memory controller that controls the memory device and generates the first and second reference voltages,
   wherein voltage levels of the first and second reference voltages are adjusted according to first and second results of performing the first and second training operations.

7. The electronic device of claim 6, wherein the memory controller comprises:
   a data receiver that samples output data of the first rank and output data of the second rank using the first and second reference voltages; and
   a multi-reference voltage generator that selectively provides the first reference voltage and the second reference voltage to the data receiver according to a rank address.

8. The electronic device of claim 6, wherein the memory controller comprises:
   a data receiver that samples output data of the first rank and output data of the second rank using the first and second reference voltages; and
   a multi-reference voltage generator that selectively provides the first reference voltage and the second reference voltage to the data receiver in synchronization with a rank interleaving period.

9. The electronic device of claim 8, wherein the multi-reference voltage generator comprises:
   a first reference voltage generator that generates the first reference voltage, wherein the first reference voltage is adjusted according to a second result of performing the second training operation on the first rank;
   a second reference voltage generator that generates the second reference voltage, wherein the second reference voltage is adjusted according to a first result of performing the first training operation on the second rank;
   a selection switch that selects one of the first reference voltage and the second reference voltage to be transferred to the data receiver; and
   a voltage reference controller that controls the selection switch in synchronization with the rank interleaving period.

10. The electronic device of claim 1, further comprising:
    a storage device that stores values of voltage levels of the first and second reference voltages, wherein the first and second reference voltages are adjusted according to first and second results of the first and second training operations.

11. The electronic device of claim 10, wherein the system-on-chip receives the values of the voltage levels of the first and second reference voltages from the storage device, and initializes the memory device using the received values.

12. A training method of an electronic device comprising a system-on-chip and a memory device, the method comprising:
    loading a first training code to an SRAM of the system-on-chip;
    performing a first training operation on a first rank of the memory device using the first training code;
    performing a second training operation on a second rank using the first training code;
    generating a first reference voltage for sampling output data of the first rank; and
    generating a second reference voltage for sampling output data of the second rank,
    wherein each of the first reference voltage and the second reference voltage is generated based on a first result of performing the first training operation and a second result of performing the second training operation.

13. The method of claim 12, further comprising:
disabling or adjusting a rank interleaving mode of the memory device before performing the first and second training operations.

14. The method of claim 12, further comprising:
loading a second first training code to the second rank of the memory device and a third training code to the first rank of the memory device.

15. The method of claim 12, wherein the first rank corresponds to a memory region in a first die, and the second rank corresponds to a memory region in a second die.

16. The method of claim 12, wherein the first reference voltage and the second reference voltage are generated in response to a rank address.

17. An electronic device, comprising:
a memory device comprising a first rank and a second rank; and
a system-on-chip that exchanges data with the memory device,
wherein the system-on-chip is configured to:
generate an address to access the memory device;
read parameters including a first reference voltage for sampling output data of the first rank and a second reference voltage for sampling output data of the second rank;
select one of the first reference voltage and the second reference voltage corresponding to the generated address; and
read data from one of the first rank and the second rank using the selected one of the first and second reference voltages.

18. The electronic device of claim 17, wherein the parameters are generated through a training operation performed on the memory device.

19. The electronic device of claim 18, wherein the system-on-chip disables a rank interleaving mode to perform the training operation.

20. The electronic device of claim 18, further comprising:
a storage device that stores the parameters as a result of performing the training operation.

* * * * *